United States Patent [19]
Sago et al.

[11] Patent Number: 5,591,262
[45] Date of Patent: Jan. 7, 1997

[54] ROTARY CHEMICAL TREATER HAVING STATIONARY CLEANING FLUID NOZZLE

[75] Inventors: Hiroyoshi Sago; Hideya Kobari; Koji Ueda; Hidenori Miyamoto, all of Kanagawa-ken; Ryuzo Takatsuki, Okayama-ken, all of Japan

[73] Assignees: Tazmo Co., Ltd., Okayama; Tokyo Ohka Kogyo Co., Ltd., Kanagawa, both of Japan

[21] Appl. No.: 410,315

[22] Filed: Mar. 24, 1995

[30] Foreign Application Priority Data

Mar. 24, 1994 [JP] Japan .................................. 6-054135

[51] Int. Cl.$^6$ ...................................................... B05C 7/00
[52] U.S. Cl. ............................... 118/52; 118/55; 118/56; 118/70; 118/306; 118/318; 118/319; 118/320; 118/326; 118/501; 134/104.1; 134/95.2; 134/95.3; 134/169 R; 134/902
[58] Field of Search .................................. 118/52, 55, 56, 118/70, 306, 318, 319, 320, 326, 501; 134/104.1, 95.2, 95.3, 169 R, 902; 156/345 L, 345 LS, 640.1; 239/121, 122, 223, 224

[56] References Cited

U.S. PATENT DOCUMENTS

| | | |
|---|---|---|
| 4,350,562 | 9/1982 | Bonii .................................... 156/640.1 |
| 4,600,463 | 7/1986 | Aigo ..................................... 156/345 L |
| 4,788,994 | 12/1988 | Shinbara ............................. 156/345 L |
| 4,968,375 | 11/1990 | Sato et al. ........................... 156/345 L |
| 4,972,797 | 11/1990 | Müller ..................................... 118/318 |
| 5,234,499 | 8/1993 | Sasaki et al. ............................. 118/52 |
| 5,415,691 | 5/1995 | Fujiyama et al. ...................... 118/501 |
| 5,498,294 | 3/1996 | Matsushita et al. .................... 134/902 |

FOREIGN PATENT DOCUMENTS 3293056  12/1991  Japan .

*Primary Examiner*—Laura Edwards
*Attorney, Agent, or Firm*—Weiner, Carrier & Burt, P.C.; Joseph P. Carrier; Irving M. Weiner

[57] ABSTRACT

The invention disclosed defined a vertically extending passage through the rotary center of an inner cup or the rotary center of a spinner in a notary chemical treater, disposes a stationary cleaning fluid nozzle in the passage, and injects the cleaning fluid from the nozzle to clean a lid of the rotary chemical treater and the underside of an object treatment within the treater. The underside of the lid and the underside of the objective part are efficiently cleaned, and the need for sealing the movable parts against the cleaning fluid is eliminated because the nozzle is stationary, ensuring the prevention of the cleaning fluid from leaking.

17 Claims, 7 Drawing Sheets

5,591,262

ROTARY CHEMICAL TREATER HAVING STATIONARY CLEANING FLUID NOZZLE

BACKGROUND OF THE INVENTION

1. Field of the Invention

This invention relates to rotary chemical treaters which apply a film-forming liquid to the surface of an object such as a semiconductor device wafer and a liquid crystal panel board, remove the liquid adhered to the surface of the object by rotating, and make developing and wet etching.

2. Description of the Related Art

For the rotary chemical treaters which are used to apply a thin film forming liquid to wafers and glass substrates, spinner type and rotary cup type rotary chemical treaters have been put to practical use.

The spinner type rotary chemical treater causes a spinner chuck to be exposed into a fixed cup to fix an object within the cup on the spinner chuck. The object is integrally rotated with the spinner chuck. This rotation generates centrifugal force to uniformly spread an application liquid, which has been dripped onto the surface of the objective part, over the surface of the objective part.

In the above chemical treater, the cup is fixed and the spinner chuck therein is rotated, resulting in producing a turbulent gas or fluid flow within the cup. As a result, it is difficult to apply the liquid uniformly, and very small dust particles adhere to the spread film, possibly deteriorating a production yield due to quality problems.

In view of above, Japanese Unexamined Patent Publication No. 3-293056 discloses a device for preventing the application atmosphere from being disturbed. What is disclosed therein is a rotary cup type chemical treater (coater). In this device, an inner cup is placed within a fixed outer cup, an object is placed in the inner cup, the top opening of the inner cup is closed with a lid, then the inner cup is rotated.

Even with the rotary chemical treater of either of the above spinner type or rotary cup type, the application liquid may reach the back face of the object or adhere to the inner wall of the cup. And, when the liquid is left as it is, it dries to become dust, which may adhere to the surface of the object in a later step.

Therefore, for the spinner type treater, a structure which injects a cleaning fluid from the peripheral edge of the spinner toward the back face of the object has been proposed. And, for the rotary cup type treater, a structure has been proposed which lifts the lid upward, exposes movable cleaning nozzles toward the inner cup interior, a cleaning fluid is dripped into the inner cup, and the inner cup is rotated.

With the rotary chemical treater of either of the above spinner type or rotary cup type, the object is generally sucked and fixed by a vacuum source to the spinner chuck. When the vacuum chuck sucks and fixes the object, an adsorption face may cause a temperature difference, or minute dust particles adhered to the adsorption face is transferred to the object, causing a disadvantage of adversely affecting the object. In particular, this disadvantage becomes noticeable when a large glass substrate is treated as the object.

Therefore, as a fixing means which does not use the vacuum chuck, a means, which holds the peripheral edge of the object by a fastening member such as pins disposed on the top of the spinner and rotates the object integrally with the spinner or the inner cup, has been proposed.

Even with the rotary chemical treater of either of the above spinner type or rotary cup type, cleaning of the treater itself and the back face of the objective part has the following problems. Namely, the rotary cup type chemical treater using the movable cleaning nozzle can clean the inner wall of the inner cup but cannot clean the underside of the lid. Therefore, the underside of the lid must be cleaned manually, the work is troublesome and complicated, labor is required, and automation is prevented.

On the other hand, employing a means for injecting the cleaning fluid from the bottom of the inner cup can clean the underside of the lid. But, a high-speed rotation of the inner cup makes it difficult to seal a joint between the inner cup and a cleaning fluid supply section to inject the cleaning fluid from the inner cup.

When the object is rotated by a, fixing means other than the vacuum chuck, the application liquid which reaches the back face of the object is required to be removed, but the cleaning mechanism provided with the vacuum chuck cannot be applied as it is.

More specifically, to fix the object by the above vacuum chuck, cleaning fluid injecting ports directed outward are disposed partly on the vacuum chuck having a smaller diameter than the object. When the fixing means for holding the outer periphery of the object by the fastening member is used, effective locations are required to be selected for the cleaning fluid injecting ports.

In this case, the effective locations for the cleaning fluid injecting ports may be where the cleaning fluid injecting ports cannot be disposed in the treater using the vacuum chuck, e.g., the center of the spinner or the inner cup. However, it is difficult to seal a joint of the rotary section and the cleaning fluid supply section as discussed above.

SUMMARY OF THE INVENTION

This invention provides a rotary chemical treater which has an outer cup for receiving a drain from a rotary inner cup disposed outside of the inner cup, wherein a vertical through passage is disposed in a rotary center of the inner cup, a cleaning fluid nozzle which is designed to be stationary is vertically inserted in the passage, and a space is formed between the cleaning fluid nozzle and the passage. A partition member such as a pipe member is positioned between the cleaning fluid nozzle and the vertical through passage to provide inside and outside passages between the through passage and the cleaning fluid nozzle. The cleaning fluid is injected from the cleaning nozzle to clean a lid, and one of the inside and outside passages is an adsorption passage and the other is a liquid waste or gas passage in an adsorption chuck type object fixing mechanism.

This invention also provides a rotary chemical treater a spinner within a stationary cup and fastening members on the top of the spinner to hold a plate-like object apart from a top surface of the spinner, wherein a vertical through passage is defined in the center of the spinner, a stationary cleaning fluid nozzle is vertically inserted in the passage, and a space is formed between the inner periphery of the passage and the outer periphery of the cleaning fluid nozzle.

The above space is used as a liquid waste passage or a gas passage. On the spinner, the fastening members are disposed to hold the plate-like object apart from the top of the spinner. As the fastening members, stepped protrusions whose upper part has a small diameter and whose lower part has a large diameter are used.

And, the top end of the passage vertically defined in the rotary center of the inner cup or in the center of the spinner is formed into a tapered hole, and the top end of the cleaning fluid nozzle which is exposed to the hole is provided with side holes or slanted holes for injecting the cleaning fluid, or the top end of the cleaning fluid nozzle is formed into an inverse triangle or fan shape, and an elongate cleaning fluid injection port is formed longitudinally at the top edge of the top end.

This invention does not rotate the cleaning fluid nozzle for both the inner cup and the spinner, and the need for sealing the movable parts against the cleaning fluid is thereby eliminated, ensuring the prevention of the cleaning fluid from leaking. And, as described above, the space which is formed between the outer periphery of the cleaning fluid nozzle and the inner periphery of the hollow passage can be used as a liquid waste passage or a gas supply passage. As a result, excess cleaning fluid can be recovered from or nitrogen gas can be supplied into the cup without requiring an additional special structure.

And, for the rotary chemical treater provided with the adsorption chuck, the space which is formed between the outer periphery of the cleaning fluid nozzle and the inner periphery of the hollow passage can be divided into inside and outside spaces. The outside space is used as an adsorption passage and communicated with the adsorption hole of the adsorption chuck, thereby forming the adsorption check mechanism for the object. Accordingly, this type of treater can intensively dispose the required components in an efficient manner. Other objects, advantages and salient features of the invention will become apparent from the following detailed description which, when taken in conjunction with the annexed drawings, describes preferred embodiments of the invention.

DETAILED DESCRIPTION OF THE INVENTION

Preferred exemplary embodiments of the invention will be described in detail with reference to the attached drawings.

Figure 1:
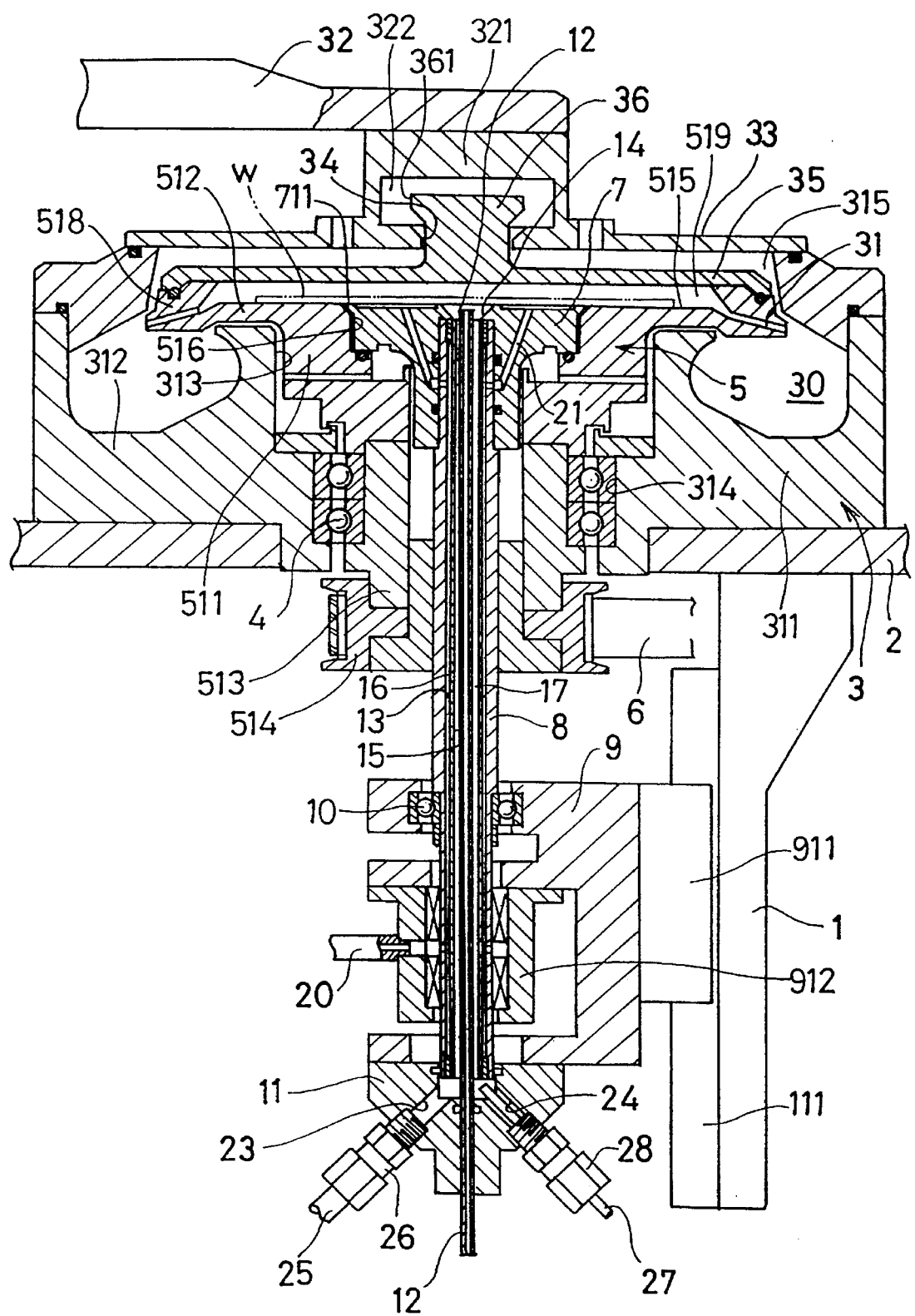
FIG. 1 is a vertical sectional side view of the essential parts of a rotary cup type chemical treater according to a preferred embodiment of the invention.
Figure 2:
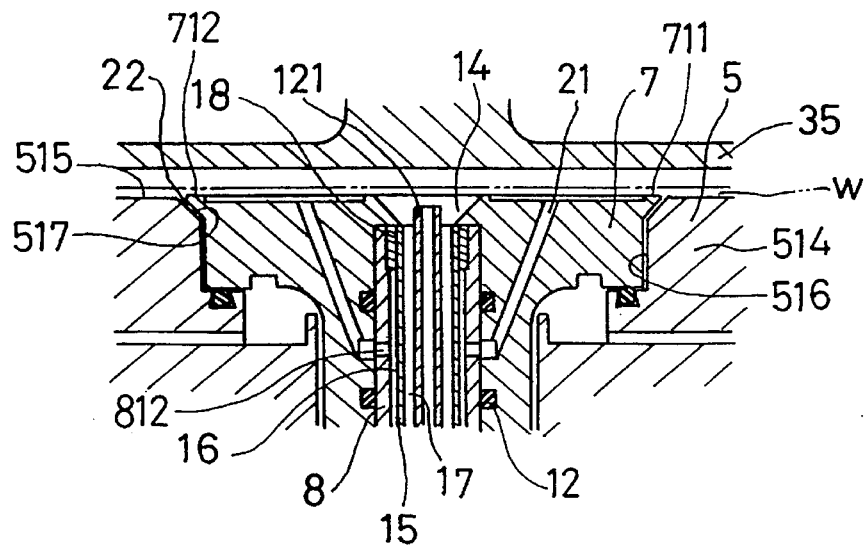
FIG. 2 is an expanded sectional view of the adsorption chuck of the rotary cup type chemical treater shown in FIG. 1.
Figure 3:
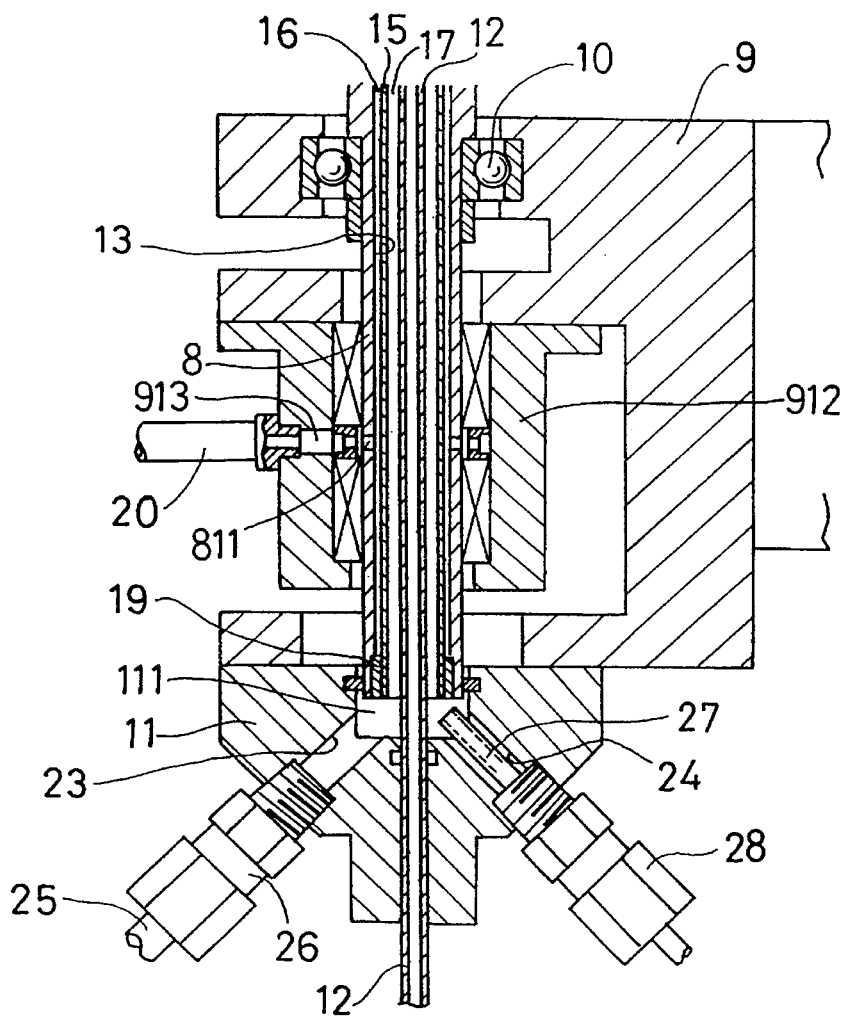
FIG. 3 is an expanded sectional view of the lower part of a spinner shaft of the rotary cup type chemical treater shown in FIG. 1.
Figure 4:
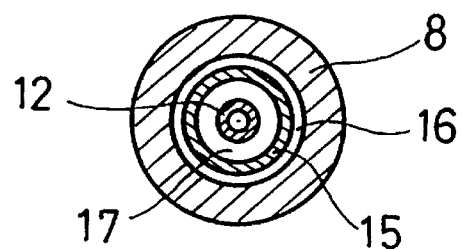
FIG. 4 is an expanded transverse sectional view showing the inner structure of the above spinner shaft.

FIG. 1 to FIG. 4 show the first example of a preferred rotary cup type chemical treater among the rotary chemical treaters of this invention. As described above, FIG. 1 is a vertical sectional side view of the essential parts, FIG. 2 is an expanded sectional view of the adsorption chuck of FIG. 1, FIG. 3 is an expanded sectional view of the lower part of a spinner shaft of FIG. 1, and FIG. 4 is an expanded transverse sectional view for clarifying the inner structure of the spinner shaft. Referring to the above drawings, the first example of the rotary cup type chemical treater of this invention will be described in detail.

Reference numeral 3 is an annular outer cup, which is fixed to a base 2 which is supported by a column 1. An inner cup 5 is rotatably fitted in the outer cup 3 via a bearing 4. The outer cup 3 has a downwardly recessed waste recovery passage 30 formed in an annular wall 311 of its outer region, and a center block 312 is provided with a recess 313 into which an intermediate lower section 511 of the inner cup 5 is fitted.

A bottom plate 512 of the inner cup 5 has a disc shape and has an adsorption chuck 7 integrally engaged at the center thereof. A lower section 513 whose diameter is smaller than the intermediate lower section 511 of the inner cup 5 is cylindrical and passes through a vertical hole, which is formed in the lower part of the outer cup 3, to hang beneath the base 2. To the bottom end of the lower section 513, for example a pulley 514 is fixed, and the inner cup 5 is rotated by a motor (not shown) via a timing belt 6.

The adsorption chuck 7 which is disposed at the center of the inner cup 5 is integrally rotated with the inner cup 5, and a downwardly extending hollow spinner shaft 8 is vertically inserted through the center of the adsorption chuck 7. The bottom end of the spinner shaft 8 is rotatably supported by a slider 9 via a bearing 10. The slider 9 has an engagement rail 911 on its back engaged with a vertical rail 111 which is disposed on the column 1, so that the slider 9 is moved up or down by a cylinder unit or the like (not shown).

Thus, the adsorption chuck 7 is supported by the slider 9 via the spinner shaft 8, so that the upward movement of the slider 9 moves the adsorption chuck 7 upward to exceed a bottom face 515 of the inner cup 5. At the raised position, an object W such as a semiconductor wafer is placed on a top face 711 of the adsorption chuck 7. Then, the slider 9 is lowered, and the adsorption chuck 7 is also lowered, such that the top face 711 of the adsorption chuck 7 is to be nearly flush with the bottom face 515 of the inner cup 5. The adsorption chuck 7 is lowered by engaging with a recess 516 formed at the bottom face of the inner cup 5. Rotation of the inner cup 5 is transmitted to the adsorption chuck 7, which is integrally rotated with the inner cup 5.

A stationary block 11 is disposed on the underside of the slider 9, and an intermediate lower section of a cleaning fluid nozzle 12 is passed through and supported by the block 11. The cleaning fluid nozzle 12 has a tube shape having a small diameter, and is passed through a hollow hole 13 corresponding to the inner diameter of the spinner shaft 8. A top end 121 of the cleaning fluid nozzle 12 is exposed to a tapered hole 14, which is formed at the center of the top face of the adsorption chuck, with the top face opened.

A pipe member 15 is vertically disposed in an annular space formed between the inner periphery of the hollow hole 13 vertically extended through the spinner shaft 8 and the outer periphery of the cleaning fluid nozzle 12. An annular outside space 16 and an annular inside space 17 are formed outside and inside of the pipe member 15 by the inner periphery of the hollow hole 13 and the outer periphery of the cleaning fluid nozzle 12 as clearly shown in FIG. 2 to FIG. 4.

The annular outside space 16 has its top and bottom ends airtightly sealed by sealing members 18, 19 respectively as shown in FIG. 2 and FIG. 3. The outside space 16 has its lower section connected to a tube 20 via a connection port 811 formed at a lower part of the spinner shaft 8 and a communicating passage 913 formed in an outside holder 912 as shown in FIG. 3. The tube 20 is connected to a vacuum pulling device (not shown). And, the outside space 16 is communicated with a suction passage 21 formed in the adsorption chuck 7 via a connection port 812 formed at an upper part of the spinner shaft 8 as shown in FIG. 2.

The suction passage 21 has its upper part radially slanted outwardly. This is to discharge outside by centrifugal force the cleaning fluid which has entered the suction passage 21 when the adsorption chuck 7 is rotated together with the inner cup 5. Because of the same reason, a joint section 517 of a top end periphery 712 of the adsorption chuck 7 and the inner cup 5 is also formed to upwardly expand outwardly.

The stationary block 11 has connection ports 23, 24, which are linked to the inside space 17, formed as shown in FIG. 3. More specifically, the connection ports 23, 24 are communicated with a recess 111 into which the bottom end of the spinner shaft 8 is fitted to the stationary block 11 and communicated with the inside space 17. The connection port 23 has a cleaning fluid recovery tube 25 connected via a connector 26. The other connection port 24 has a nozzle 27 for injecting an atmosphere gas such as nitrogen gas connected via a connector 28.

Passages 31 . . . which serve as drain and discharge passages open to the recovery passage 30 of the outer cup 3 are radially formed in an outer periphery 518 of the inner cup 5. The passages 31 . . . are disposed to be downwardly slanted outwardly from the outer edge of the bottom face 515 of the inner cup 5, so that the open ends are directed to the recovery passage 30. An opening/closing arm 32 which is pivotably moved is disposed above the outer cup 3 and the inner cup 5. And the arm 32 supports the lid 33, which opens and closes an upper open section 315 of the outer cup 3.

The lid 35, which opens and closes an upper open section 519 of the inner cup 5 having a small diameter, is disposed beneath the lid 35. This lid 35 is provided with a shaft 36 having a flange 361 and being protruded upward at the center. The shaft 36 is passed through an opening 34 into a hollow recess 322 of a bracket 321 to be held by the bracket 321. And, the upper and lower lids 33, 35 are synchronized to be opened or closed.

In the above structure, to apply the application liquid to the objective part W, the arm 32 is first moved to lift the lids 33, 35 of the outer and inner cups 3, 5, thereby opening the upper open sections 315, 519 of the cups 3, 5. At the same time, with the adsorption chuck 7 raised higher than the bottom face 515 of the inner cup 5 by the upward movement of the slider 9, the object W is placed on the adsorption chuck 7. The top face of the adsorption chuck 7 where the objective part is placed receives a negative pressure or suction force through the suction passage 21, the outside space 16 in the spinner shaft 8 communicated with the suction passage 21, and the tube 20, thereby adsorbing to fix the object W onto the adsorption chuck 7.

Then, the adsorption chuck 7 is lowered to engage the recess 516 of the inner cup 5 with the adsorption chuck 7, and the application liquid is dripped onto the center of the object. And, the arm 32 is moved to lower the lids 33, 35, thereby closing the open sections 315, 519 of the outer and inner cups 3, 5. This state is shown in FIG. 1 and FIG. 2. Then, the inner cup 5 is rotated, the integral adsorption chuck 7 is rotated accordingly there with, and the object is also rotated. In this example the rotational movement is caused by driving the timing belt 6 which is led through the pulley 514 as described above. The above rotational movement generates centrifugal force to uniformly spread the application liquid, which has been dripped onto the surface of the object W, on the surface of the object W. By the centrifugal force generated by the rotation of the inner cup 5, gas within the inner cup 5 is discharged into the recovery passage 30 of the outer cup 3 through the drain/discharge passages 31 . . . . Therefore, the inner cup 5 has its interior pressure reduced, and gas dissolved in the application liquid is also removed therefrom.

To clean the inner lid 35, the lids 33, 35 are closed and the inner cup 5 is rotated without the objective part W set on the absorption chuck 1. While rotating the inner cup 5, the cleaning fluid is injected from the top end 121 of the cleaning fluid nozzle 12 to clean the underside of the lid 35 of the inner cup 5.

Figure 5:
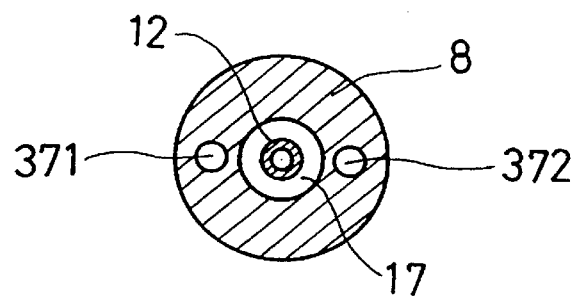
FIG. 5 is an expanded transverse sectional view showing another example of the spinner shaft.

FIG. 5 is a transverse sectional view showing another example of the spinner shaft 8. In this example, the spinner shaft 8 is formed to have a thick wall, and passages 371, 372 corresponding to the above spaces 16, 17 are vertically bored through the thick wall.

Figure 6:
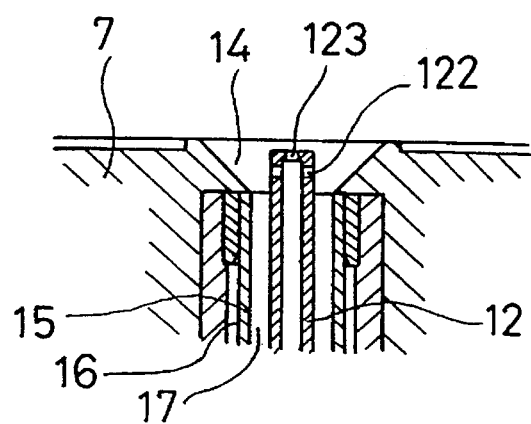
FIG. 6 is an expanded vertical sectional view of the essential parts of another example of the cleaning fluid nozzle.
Figure 7:
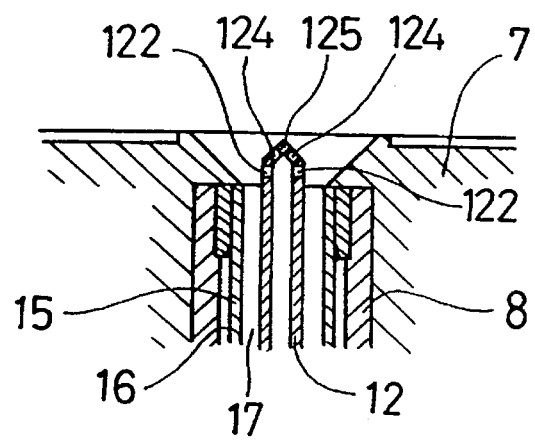
FIG. 7 is an expanded vertical sectional view of the essential parts of still another example of the cleaning fluid nozzle.
Figure 8:
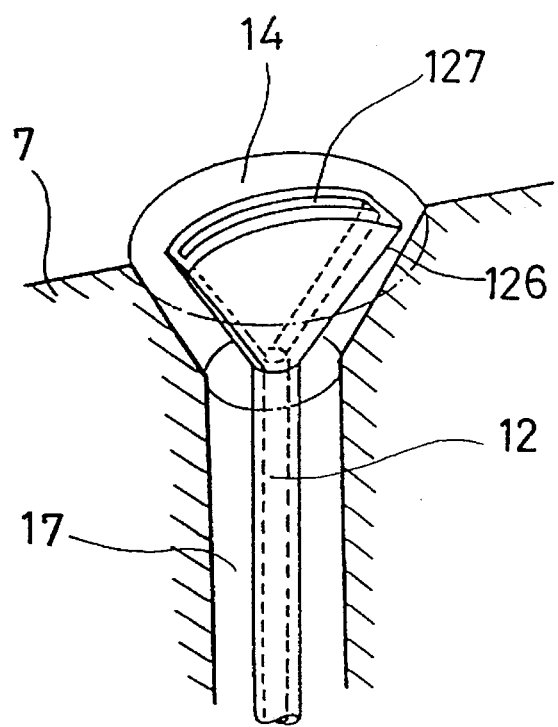
FIG. 8 is an explanatory perspective view of the essential parts of yet another example of the cleaning fluid nozzle.

FIG. 6 to FIG. 8 show other examples of the cleaning fluid nozzle.

FIG. 6 shows a modified example of the cleaning fluid injection port of the cleaning nozzle 12 having the top end exposed to the tapered hole 14 of the adsorption chuck 7. In this example, injection ports 122, 122 are formed in the side wall of the leading end section of the cleaning nozzle 12, and an injection port 123 is formed at the top end. This example can effectively clean the adsorption chuck 7 and the inner wall of the inner cup 5 because the cleaning fluid is spread upward and sideward.

FIG. 7 shows an example in which the top end of the cleaning nozzle 12 is formed into a conical shape, side injection ports 122, 122 are formed below the top end in the same way as above, and slant injection ports 124, 124 are formed in a conical section 125.

FIG. 8 shows an example in that the top end of the nozzle 12 is formed into a flat fan shape along the tapered hole 14 of the adsorption chuck 7, and an elongate injection port 127 is formed longitudinally at the top edge of a part 126.

In the examples of FIG. 7 and FIG. 8, the underside of a large lid can be surely cleaned.

Figure 9:
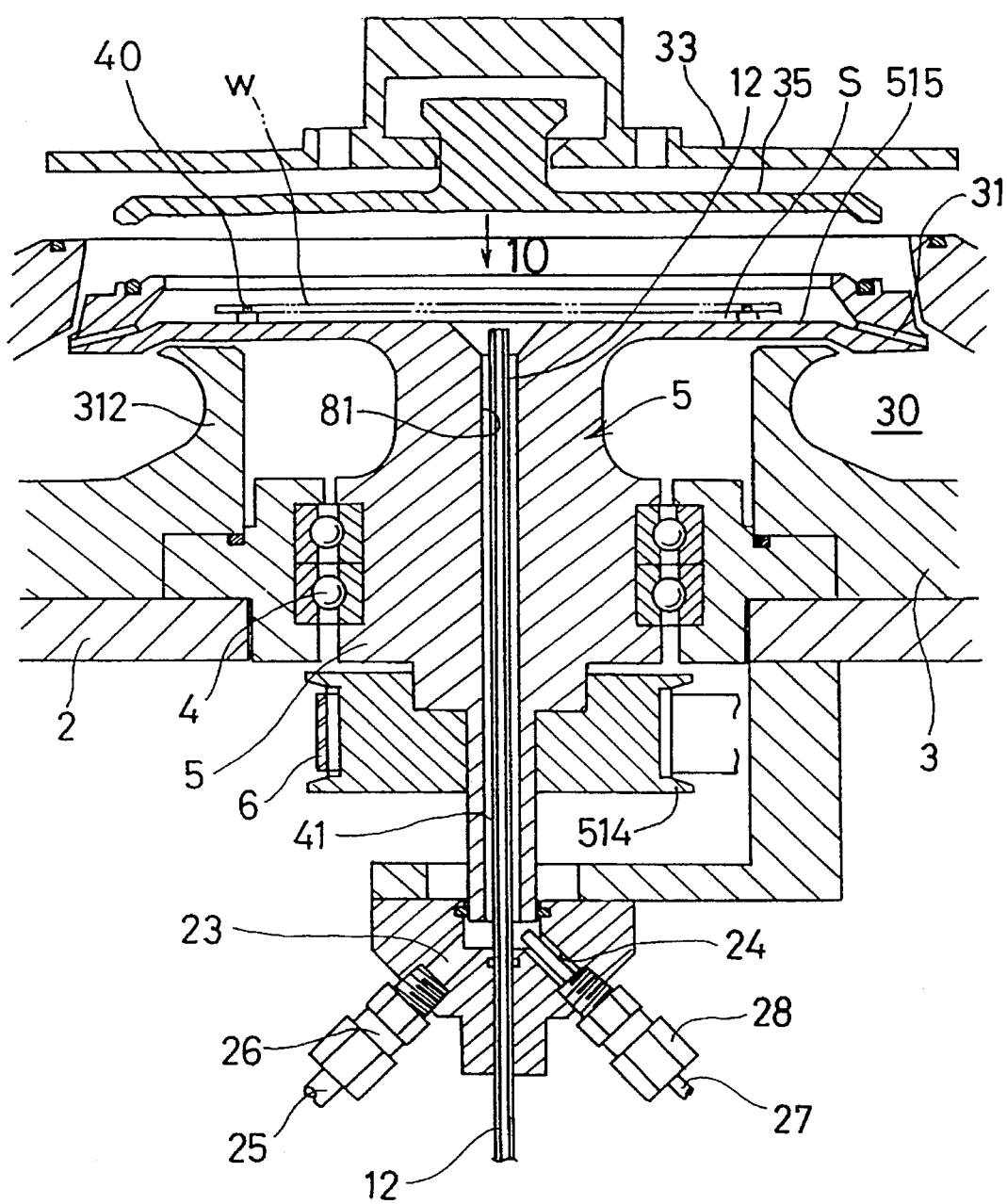
FIG. 9 is a vertical sectional side view of the essential parts of a second embodiment of the rotary cup type chemical treater of this invention.

FIG. 9 is a vertical sectional side view of the second preferred example of the rotary chemical treater. This example shows a coater for applying a chemical to an object such as a glass substrate W for a liquid crystal panel. In this example, the same components as those in the above example are given the same reference numerals, and their description will be omitted.

Figure 10:
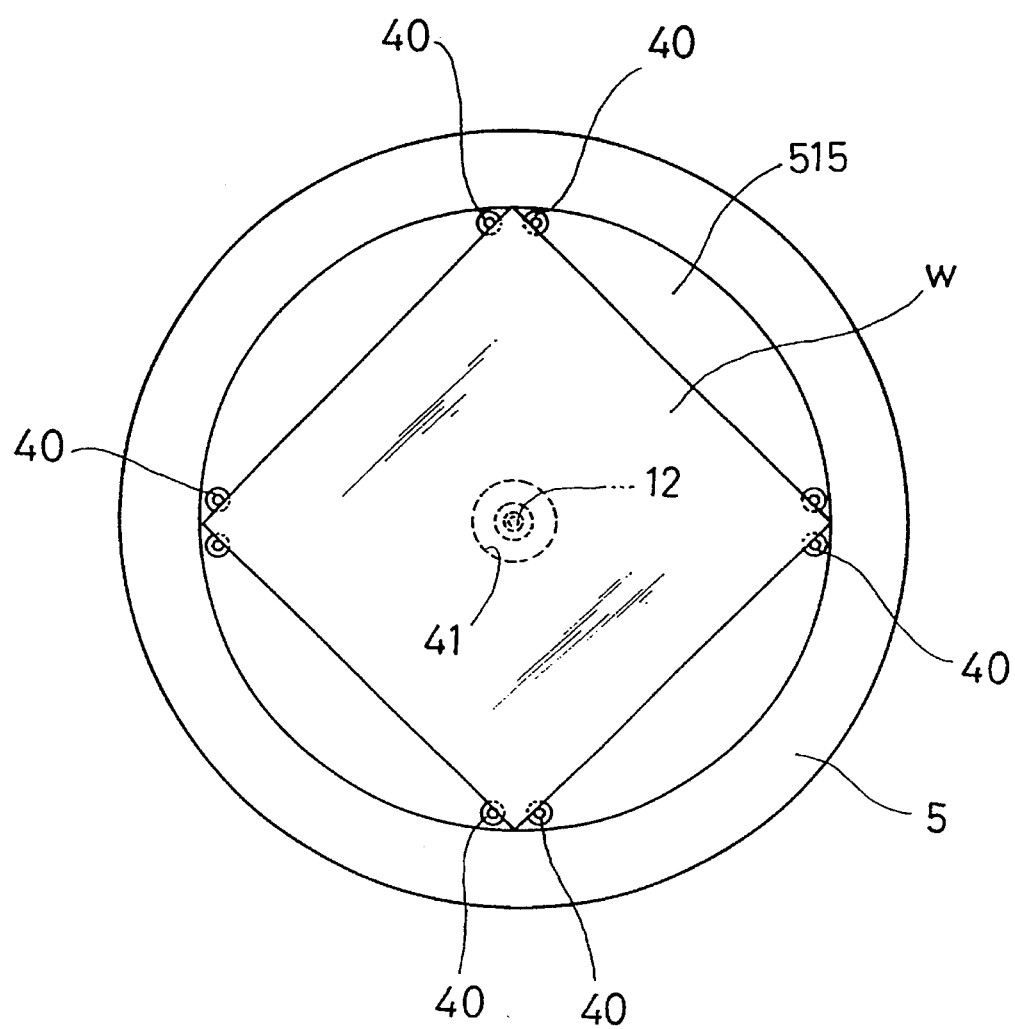
FIG. 10 is a view seen from the arrow 10 of FIG. 9.

The coater of this example is not provided with an adsorption chuck. Stepped protrusions 40, 40, whose upper part has a small diameter and lower part a large diameter, are disposed to hold each corner of the substrate W therebetween on the bottom face 515 of the inner cup 5 as clearly shown in FIG. 10. The protrusions 40, 40 are disposed at four positions at intervals of 90 degrees on the bottom face 515 of the inner cup 5. The glass substrate W is held by the stepped parts of these stepped protrusions 40, 40 . . . with a space S above the bottom face 515 of the inner cup 5 and rotated under such a state.

This example forms a vertical hole 81 at the center of the inner cup 5 and does not use the adsorption chuck, so that the above adsorption space is not required. Within the vertical hole 81, the cleaning fluid nozzle 12 is vertically passed through in the same way as above, and an annular space 41 having the same function as the above inside space 17 is formed between the outer periphery of the nozzle 12 and the inner periphery of the vertical hole 81.

In the above example, to clean the lid 35, the lids 33, 35 are closed and the inner cup 5 is rotated without the object set on the protrusions 40. And the cleaning fluid is injected from the cleaning fluid nozzle 12 to clean the back face of the lid 35 of the inner cup 5 and the inner wall of the inner cup 5. Since the space S is provided between the underside of the object W and the bottom face 515 of the inner cup 5, the underside of the objective part W can also be cleaned if set on the protrusions 40. In this example, the cleaning nozzle 12 is positioned at the center of the underside of the object W, so that cleaning fluid injected therefrom may clean the chemical which has reached about the center of the underside of the object W.

Figure 11:
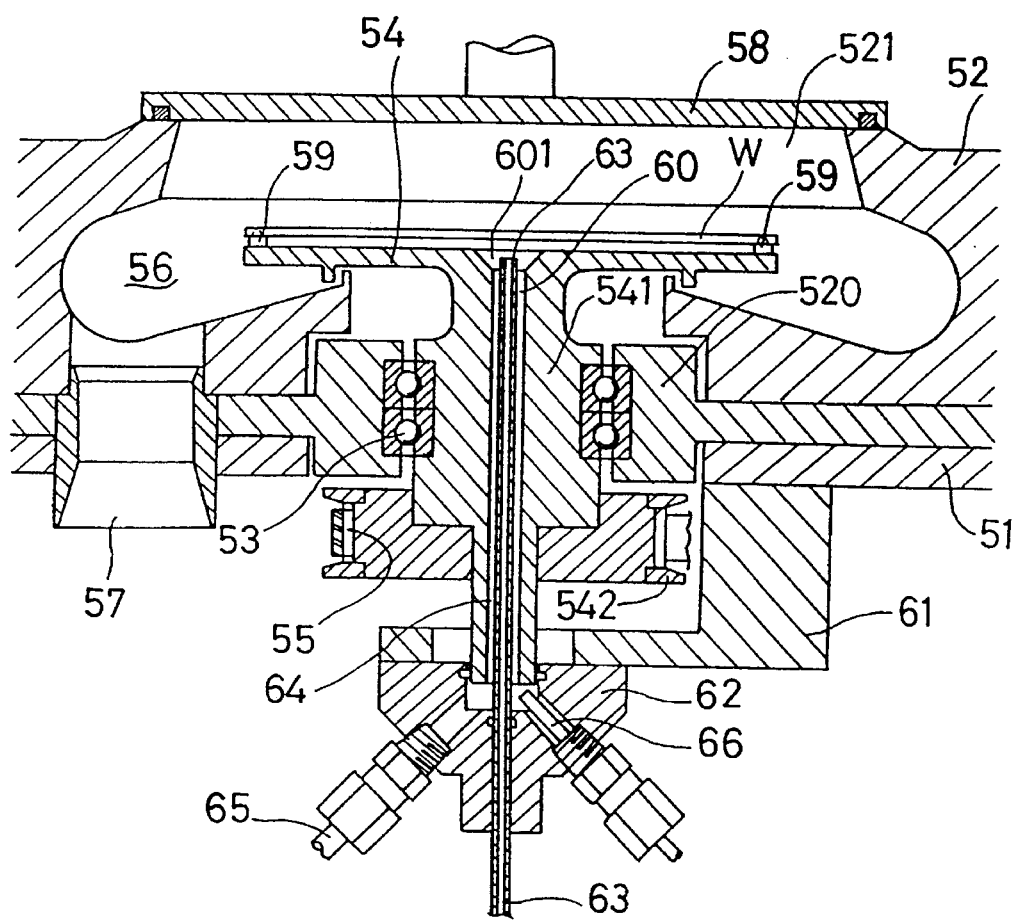
FIG. 11 is a rotary chemical treater of this invention, showing a vertical sectional side view of the essential parts of a spinner type chemical treater.

FIG. 11 is a vertical sectional side view of the essential parts of a spinner type chemical treater among the preferred rotary chemical treaters according to this invention.

The spinner type chemical treater has an annular stationary cup 52 fixed on a base 51, and a spinner 54 rotatably disposed within the stationary cup 52. The spinner 54 has a large diameter section 541 at an intermediate lower portion thereof supported by a bearing section 520 of the base 51 via a bearing 53, and is rotated by a timing belt 55 which is led through a pulley 542 at the bottom.

A recovery passage 56 for the application liquid and the cleaning fluid is formed inside the stationary cup 52 and outside the spinner 54. The application liquid and the cleaning fluid which have been discharged into the recovery passage 56 are discharged through a drain pipe 57 which is formed at a part of the bottom of the recovery passage 56. A top opening 521 of the stationary cup 52 is detachably closed by a lid 58. The top of the spinner 54 is provided with stepped protrusions 59 . . . to hold the object W such as a glass substrate, and the stepped protrusions 59 . . . have the same structure and function as the above stepped protrusions 40.

On the other hand, in the rotary center of the spinner 54, a passage 60 is vertically formed. And, a bracket 61 is disposed on the underside of the base 51, and a stationary block 62 is disposed on the underside of the bracket 61. A cleaning fluid nozzle 63 has its lower part fixed to and supported by the stationary block 62, the cleaning fluid nozzle 63 vertically passes through the center of the passage 60, and an annular space 64 is formed between the passage 60 and the nozzle 63. The passage 60 which is formed in the rotary center of the spinner 54 has its top end formed into a tapered hole 601 which is enlarged upward.

The block 62 is provided with a cleaning fluid recovery tube 65 communicated with the space 64, and a nozzle 66 for injecting an atmosphere gas such as nitrogen gas. For the structure of the leading end of the nozzle 63 in this example, those shown in FIG. 6 to FIG. 8 can be adopted.

With the above structure, to clean the underside of the object W, the spinner 54 is rotated with the object W set on the protrusions 59. And, the cleaning fluid is injected from the cleaning fluid nozzle 63 to clean the underside of the object W.

In the above examples of preferred embodiments, a chemical coating apparatus has been used to describe the rotary chemical treater of this invention, but the invention can also be used as a dryer for removing the liquid adhered to the surface of the object by rotating.

The invention has been described in detail above. According to this invention, the hollow passage is vertically formed to pass through the rotary center of the inner cup of the rotary cup type chemical treater or the rotary center of the spinner of the spinner type chemical treater, and the cleaning fluid nozzle is inserted within passage to form the space between the outer periphery of the nozzle and the inner periphery of the passage. Through such construction, the cleaning fluid nozzle is not rotated together with the inner cup or the spinner, eliminating the need for sealing the movable parts against the cleaning fluid, and ensuring the prevention of the cleaning fluid from leaking.

The space formed between the outer periphery of the cleaning fluid nozzle and the inner periphery of the hollow passage can be used for the liquid waste passage and/or the gas supply passage. As a result, the excess cleaning fluid can be recovered or nitrogen gas can be supplied into the inner cup without requiring an additional special structure.

In the structure having the adsorption chuck for the rotary chemical treater, the space between the outer periphery of the cleaning fluid nozzle and the inner periphery of the hollow passage is divided into inside and outside spaces, so that the outside space is used as the adsorption passage and communicated with the adsorption port of the adsorption chuck, thereby forming the adsorption chuck structure for the object. This type of treater can intensively dispose the required components.

And, the top end of the hollow passage is formed into the tapered hole which is enlarged upward and the top end of the cleaning fluid nozzle may be provided with side holes to inject the cleaning fluid toward the tapered hole, so that the cleaning fluid can be injected to disperse efficiently. When the top end of the cleaning fluid nozzle is provided with the slanted injection port or is formed into the fan shape, the underside of the lid having a large diameter can be thoroughly cleaned.

This invention has the aforementioned advantages.

Although there have been described what are at present considered to be the preferred embodiments of the invention, it will be understood that modifications and variations may be made thereto without departing from the spirit and essence thereof. The scope of the invention is indicated by the appended claims.

What is claimed is:

1. A rotary chemical treater, comprising:

a rotary inner cup;

an outer cup for receiving a drain from the rotary inner cup, the outer cup being disposed outside of the inner cup;

a vertical through passage defined in a rotary center of the inner cup;

a stationary cleaning fluid nozzle vertically disposed in the through passage;

a space being defined about the cleaning fluid nozzle within the passage such that said nozzle does not contact said rotary inner cup: and said space being defined between an inner periphery of the vertical through passage and an outer periphery of the cleaning fluid nozzle, and forming at least one of a liquid waste passage and a gas supply passage in fluid communication with an interior space within the rotary inner cup.

2. A rotary chemical treater according to claim 1, further including a stationary block, and the cleaning fluid nozzle is fixed to and supported by said stationary block.

3. A rotary chemical treater according to claim 1, wherein fastening members are disposed on an upper surface of the inner cup to hold a substantially flat object apart from the upper surface of the inner cup.

4. A rotary chemical treater according to claim 3, wherein said fastening members are stepped protrusions, each said protrusion having upper part with a small diameter and lower part with a large diameter.

5. A rotary chemical treater according to claim 1, wherein a top end of the passage is formed into a tapered hole which is enlarged upward and a top end of the cleaning fluid nozzle is provided with side holes to inject the cleaning fluid toward the tapered hole.

6. A rotary chemical treater according to claim 1, wherein a top end of the passage is formed into a tapered hole which is enlarged upward and a top end of the cleaning fluid nozzle is provided with an injection port for slantingly injecting cleaning fluid toward an underside of the object.

7. A rotary chemical treater according to claim 1, wherein a top end of the passage is formed into a tapered hole which is enlarged upward, a top end of the cleaning fluid nozzle is formed into a substantially inverse triangular shape with an elongate cleaning fluid injection port formed longitudinally at a top edge thereof.

8. A rotary chemical treater comprising:

a rotary inner cup;

an outer cup for receiving a drain from the rotary inner cup, said drain being disposed outside of the inner cup;

a vertical through passage defined in a rotary center of the inner cup;

a stationary cleaning fluid nozzle vertically disposed in the through passage;

a space being defined about the cleaning nozzle within the passage such that said nozzle does not contact said rotary inner cup;

an absorption chuck disposed in operative cooperation with said inner cup to fix an object to the center of the inner cup and to integrally rotate the object with the inner cup, said cleaning fluid nozzle being disposed to pass through the absorption chuck; and a partition positioned between the cleaning fluid nozzle and the vertical through passage to provide inside and outside spaces between an outer periphery of the cleaning fluid nozzle and an inner periphery of the vertical through passage.

9. A rotary chemical treater according to claim 8, wherein said partition is a pipe member, which forms inside and outside annular spaces between the outer periphery of the cleaning fluid nozzle and the inner periphery of the vertical through passage.

10. A rotary chemical treater according to claim 9, wherein said outside and inside annular spaces respectively form an adsorption passage communicated with the adsorption chuck and a liquid waste or gas passage.

11. A rotary chemical treater, comprising:

a stationary cup;

a spinner disposed within said stationary cup;

fastening members disposed on an upper surface of the spinner to hold a substantially planar object apart from the upper surface of the spinner;

the vertical through passage defined in a center of the spinner;

a stationary cleaning fluid nozzle vertically disposed in the passage;

a space being defined between an inner periphery of the passage and an outer periphery of the cleaning fluid nozzle such that the nozzle does not contact said spinner; and said space between the inner periphery of the passage and the outer periphery of the cleaning fluid nozzle forming at least one of a liquid waste passage and a gas supply passage in fluid communication with an interior space of said rotary chemical treater.

12. A rotary chemical treater according to claim 10, further including a stationary block, and the cleaning fluid nozzle is fixed to and supported by said stationary block.

13. A rotary chemical treater according to claim 11, wherein said fastening members are stepped protrusions, each protrusion having an upper part with a small diameter and a lower part with a large diameter.

14. A rotary chemical treater according to claim 11, wherein a top end of the passage is formed into a tapered hole which is enlarged upward and a top end of the cleaning fluid nozzle is provided with side holes to inject the cleaning fluid toward the tapered hole.

15. A rotary chemical treater according to claim 11, wherein a top end of the passage is formed into a tapered hole which is enlarged upward and a top end of the cleaning fluid nozzle is provided with an injection port for slantingly injecting cleaning fluid toward an underside of the object.

16. A rotary chemical treater according to claim 11, wherein a top end of the passage is formed into a tapered hole which is enlarged upward, a top end of the cleaning fluid nozzle is formed into a substantially inverse triangular shape with an elongate cleaning fluid injection port formed longitudinally at a top edge thereof.

17. A cleaning device for use in a rotary chemical treater having a stationary cup and a lid for enclosing a workpiece the cleaning device comprising:

a rotatable workpiece supporting member for supporting the workpiece within the stationary cup;

a vertically extending through passage defined in a rotational center of said rotatable workpiece supporting member;

a stationary cleaning fluid nozzle disposed within said through passage such that a discharge end of said nozzle opens within an interior of the rotary chemical treater defined between the workpiece supporting member and the lid;

a space being defined between an outer periphery of said nozzle and inner periphery of said through passage so that the nozzle does not contact the rotatable workpiece supporting member, said space communicating with said interior of the rotary chemical treater; and said space forming at least one of a liquid waste passage for draining waste liquid from said interior of the rotary chemical treater and a gas supply passage for supplying gas to said interior of the rotary chemical treater.

* * * * *

UNITED STATES PATENT AND TRADEMARK OFFICE
CERTIFICATE OF CORRECTION

PATENT NO. : 5,591,262
DATED : January 7, 1997
INVENTOR(S) : Hiroyoshi Sago; Hideya Kobari; Koji Ueda; Hidenori Miyamoto and Ryuzo Takatsuki It is certified that error appears in the above-indentified patent and that said Letters Patent is hereby corrected as shown below:

On the title page item [57],
Abstract: line 3, change "notary" to --rotary--.

Column 6, line 14, chnage "object W, on" to --object W, over--.

Column 6, line 23, change "1" to --7--.

Column 2, line 54, after "treater" insert --having--.

Column 2, line 64, after "top" insert --surface--.

Column 4, line 50, delete " to be".

Column 8, line 14, after "within" insert --the--.

Signed and Sealed this

First Day of April, 1997

Attest:

BRUCE LEHMAN

*Attesting Officer*  Commissioner of Patents and Trademarks